United States Patent
Kwak

(10) Patent No.: US 12,362,024 B2
(45) Date of Patent: Jul. 15, 2025

(54) MEMORY DEVICE PERFORMING PROGRAM OPERATION AND METHOD OF OPERATING THE SAME

(71) Applicant: SK hynix Inc., Icheon-si (KR)

(72) Inventor: Dong Hun Kwak, Icheon-si (KR)

(73) Assignee: SK hynix Inc., Incheon-si (KR)

( * ) Notice: Subject to any disclaimer, the term of this patent is extended or adjusted under 35 U.S.C. 154(b) by 126 days.

(21) Appl. No.: 18/360,593

(22) Filed: Jul. 27, 2023

(65) Prior Publication Data

US 2024/0274210 A1 Aug. 15, 2024

(30) Foreign Application Priority Data

Feb. 14, 2023 (KR) .......................... 10-2023-0019552

(51) Int. Cl.
| | |
|---|---|
| *G11C 8/08* | (2006.01) |
| *G11C 16/08* | (2006.01) |
| *G11C 16/10* | (2006.01) |
| *G11C 16/34* | (2006.01) |

(52) U.S. Cl.
CPC .......... *G11C 16/3459* (2013.01); *G11C 16/08* (2013.01); *G11C 16/102* (2013.01)

(58) Field of Classification Search
CPC ... G11C 16/3459; G11C 16/08; G11C 16/102; G11C 11/5628; G11C 16/0483; G11C 16/10; G11C 16/3404
See application file for complete search history.

(56) References Cited

U.S. PATENT DOCUMENTS

| | | | | |
|---|---|---|---|---|
| 2008/0266971 | A1* | 10/2008 | Aritome ............. | G11C 16/3454 365/185.22 |
| 2010/0054042 | A1* | 3/2010 | Miki ...................... | G11C 29/02 365/208 |
| 2013/0182505 | A1* | 7/2013 | Liu ......................... | G11C 16/10 365/185.17 |
| 2019/0355408 | A1* | 11/2019 | Shin ..................... | G11C 11/4093 |
| 2022/0375525 | A1* | 11/2022 | Iwasaki ............... | G11C 11/5628 |
| 2024/0168640 | A1* | 5/2024 | Luo ........................ | G06F 3/0613 |

FOREIGN PATENT DOCUMENTS

KR 1020190084408 A 7/2019

* cited by examiner

*Primary Examiner* — Hien N Nguyen
(74) *Attorney, Agent, or Firm* — WILLIAM PARK & ASSOCIATES LTD.

(57) ABSTRACT

A method of operating a memory device includes performing a first program operation on first memory cells connected to a first channel region among a plurality of channel regions formed by separating one channel hole into the plurality of channel regions, based on a first verify voltage. The method also includes performing a second program operation on second memory cells connected to a second channel region among the plurality of channel regions, based on a second verify voltage. The method further includes determining third memory cells having a threshold voltage lower than a target threshold voltage distribution among the first memory cells while performing the second program operation. The method additionally includes performing a third program operation on the third memory cells.

19 Claims, 9 Drawing Sheets

COUPLING EFFECT

FIG. 7

| DIVISION | PGM1 | PGM2 | SIZE COMPARISON |
|---|---|---|---|
| START PROGRAM VOLTAGE | $V_{pgm1}$ | $V_{pgm2}$ | $V_{pgm1} < V_{pgm2}$ |
| UNIT VOLTAGE | $\Delta V1$ | $\Delta V2$ | $\Delta V1 > \Delta V2$ |
| VERIFY VOLTAGE | $V_{vfy1}$ | $V_{vfy2}$ | $V_{vfy1} < V_{vfy2}$ |
| PROGRAM PASS VOLTAGE | $V_{passP1}$ | $V_{passP2}$ | $V_{passP1} < V_{passP2}$ |
| VERIFY PASS VOLTAGE | $V_{passV1}$ | $V_{passV2}$ | $V_{passV1} < V_{passV2}$ |

FIG. 8A

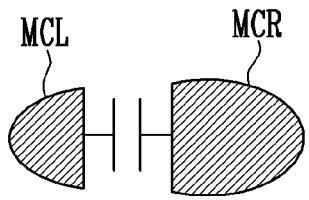

FIG. 8B

| DIVISION | MCL | MCR |
|---|---|---|
| NUMBER OF BITS STORED IN MEMORY CELL | m | n (AT THIS TIME, n > m) |
| PROGRAM ORDER | 1st | 2nd |

MEMORY DEVICE PERFORMING PROGRAM OPERATION AND METHOD OF OPERATING THE SAME

CROSS-REFERENCE TO RELATED APPLICATION

The present application claims priority under 35 U.S.C. § 119(a) to Korean patent application number 10-2023-0019552 filed on Feb. 14, 2023, in the Korean Intellectual Property Office, the entire disclosure of which is incorporated by reference herein.

BACKGROUND

1. Technical Field

The present disclosure relates to a semiconductor device, and more particularly, to a program operation of a memory device.

2. Description of Related Art

A memory device is a device storing data, and may be classified as a volatile memory device or a nonvolatile memory device.

The memory device may include a memory cell array. The memory cell array may include a stack in which a plurality of insulating layers and a plurality of conductive layers are alternately stacked, and a channel hole passing through the stack. A three-dimensional memory device may form a plurality of channel regions by dividing one channel hole into two or more regions through a cutting structure. Accordingly, because two or more memory cells may be formed along the channel hole in one layer of a conductive layer, an integration degree of the memory cells may be increased.

A coupling effect may occur between memory cells facing each other through a plurality of separately formed channel regions. The coupling effect may refer to an effect in which memory cells interfere with each other as a distance between the memory cells is shortened due to a high integration degree. A threshold voltage distribution of the memory cells may be changed due to the coupling effect.

SUMMARY

An embodiment of the present disclosure provides a memory device and a method of operating the same capable of improving a threshold voltage distribution of a memory cell.

According to an embodiment of the present disclosure, a method of operating a memory device may include: performing a first program operation on first memory cells connected to a first channel region among a plurality of channel regions formed by separating one channel hole into the plurality of channel regions, based on a first verify voltage; performing a second program operation on second memory cells connected to a second channel region among the plurality of channel regions, based on a second verify voltage; determining third memory cells having a threshold voltage lower than a target threshold voltage distribution among the first memory cells while performing the second program operation; and performing a third program operation on the third memory cells.

According to an embodiment of the present disclosure, a method of operating a memory device may include: performing a first program operation so that first memory cells connected to a first channel region among a plurality of channel regions, formed by separating one channel hole into the plurality of channel regions, are included in a first target threshold voltage distribution; performing a second program operation so that second memory cells connected to a second channel region among the plurality of channel regions are included in a second target threshold voltage distribution; detecting third memory cells having a threshold voltage lower than the second target threshold voltage distribution among the first memory cells while performing the second program operation; and performing a third program operation on the third memory cells.

According to an embodiment of the present disclosure, a memory device may include: first memory cells connected to a first channel region; second memory cells connected to a second channel region adjacent to the first channel region; a voltage generator configured to generate a plurality of program voltages, a first verify voltage, and a second verify voltage higher than the first verify voltage; a row decoder configured to apply the plurality of program voltages to a word line connected to selected memory cells among the first memory cells or to apply the plurality of program voltages to a word line connected to selected memory cells among the second memory cells; a page buffer group configured to sense the first memory cells based on the first verify voltage or sense the second memory cells based on the second verify voltage; and control logic configured to control the voltage generator, the row decoder, and the page buffer group to perform a program operation on the first memory cells based on the plurality of program voltages and the first verify voltage, perform the program operation on the second memory cells based on the plurality of program voltages and the second verify voltage, and additionally perform the program operation on some memory cells among the first memory cells.

According to the present technology, a memory device and a method of operating the same capable of improving a threshold voltage distribution of a memory cell are provided.

BRIEF DESCRIPTION OF THE DRAWINGS

FIG. 7 is a diagram illustrating voltages generated during a program operation according to an embodiment of the present disclosure.

FIGS. 8A and 8B are a diagram and a table illustrating an order in which a program operation is performed according to an embodiment of the present disclosure.

DETAILED DESCRIPTION

Specific structural or functional descriptions of embodiments according to the concept of the present disclosure disclosed in the present specification or application are illustrated only to describe the embodiments according to the concept of the present disclosure. The embodiments according to the concept of the present disclosure may be carried out in various forms and are not limited to the embodiments described in the present specification or application.

Figure 1:
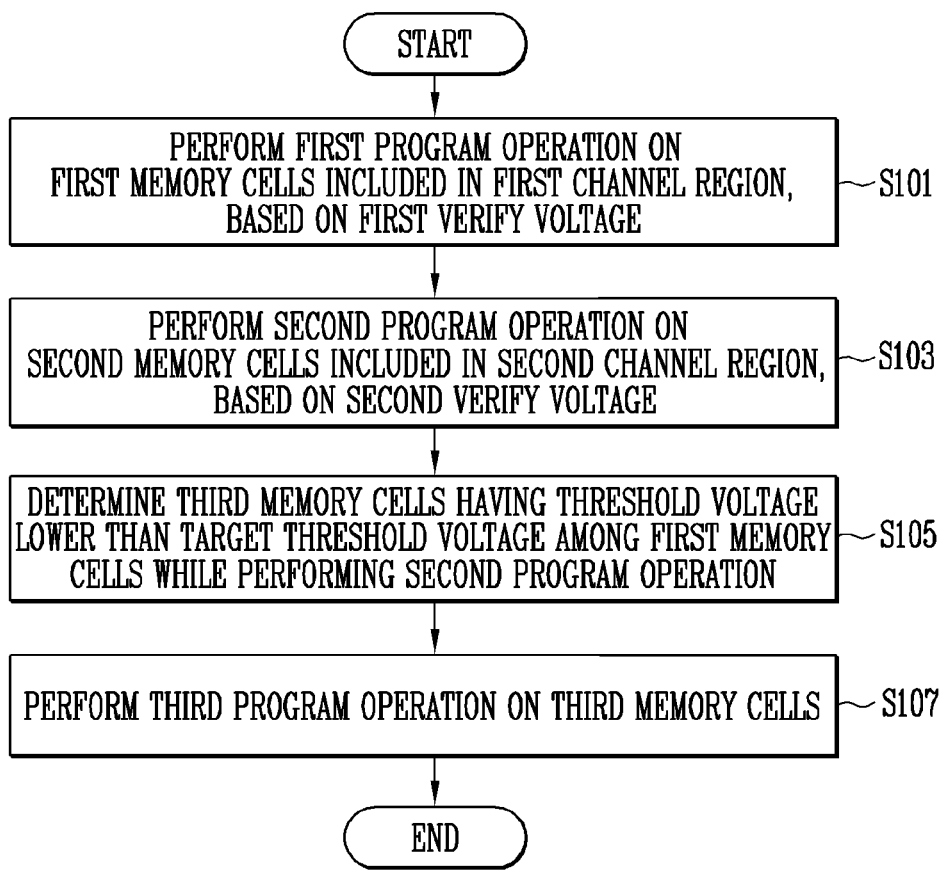
FIG. 1 is a flowchart illustrating a method of operating a memory device according to an embodiment of the present disclosure.

FIG. 1 is a flowchart illustrating a method of operating a memory device according to an embodiment of the present disclosure. The method of FIG. 1 may be performed by a memory device 1000 of FIG. 2. The memory device 1000 is described in detail with reference to FIG. 2 to be described later.

Referring to FIG. 1, in step S101, the memory device 1000 may perform a first program operation on first memory cells connected to a first channel region among a plurality of channel regions, based on a first verify voltage. The plurality of channel regions may be formed by separating one channel hole.

Specifically, the memory device 1000 may perform the first program operation so that the first memory cells are included in a first target threshold voltage distribution.

In step S103, the memory device 1000 may perform a second program operation on second memory cells connected to a second channel region among the plurality of channel regions, based on a second verify voltage. In an embodiment, the second verify voltage may be a voltage for verifying whether the second memory cells are included in the target threshold voltage distribution. In an embodiment, the first verify voltage may be lower than the second verify voltage.

Specifically, the memory device 1000 may perform the second program operation so that the second memory cells are included in a second target threshold voltage distribution. At this time, the second target threshold voltage distribution may be a final target threshold voltage distribution. In an embodiment, the first target threshold voltage distribution may include threshold voltages lower than a highest threshold voltage of the second target threshold voltage distribution.

In step S105, the memory device 1000 may determine third memory cells having a threshold voltage lower than the target threshold voltage distribution among the first memory cells while performing the second program operation. In an embodiment, the third memory cells may be memory cells included in selected memory cells among the first memory cells. That is, the third memory cells may refer to memory cells which are to be programmed to have a specific program state rather than an erase state but are not included in the target threshold voltage distribution even after a program voltage is applied according to the first program operation and the second program operation.

In step S107, the memory device 1000 may perform a third program operation on the third memory cells.

Meanwhile, each program operation may include at least one or more program loops. Each program loop may include a program voltage apply operation of applying the program voltage to a selected word line and a verify operation of verifying a program state of memory cells.

Specifically, the memory device 1000 may perform the third program operation so that the third memory cells are included in the second target threshold voltage distribution.

Figure 2:
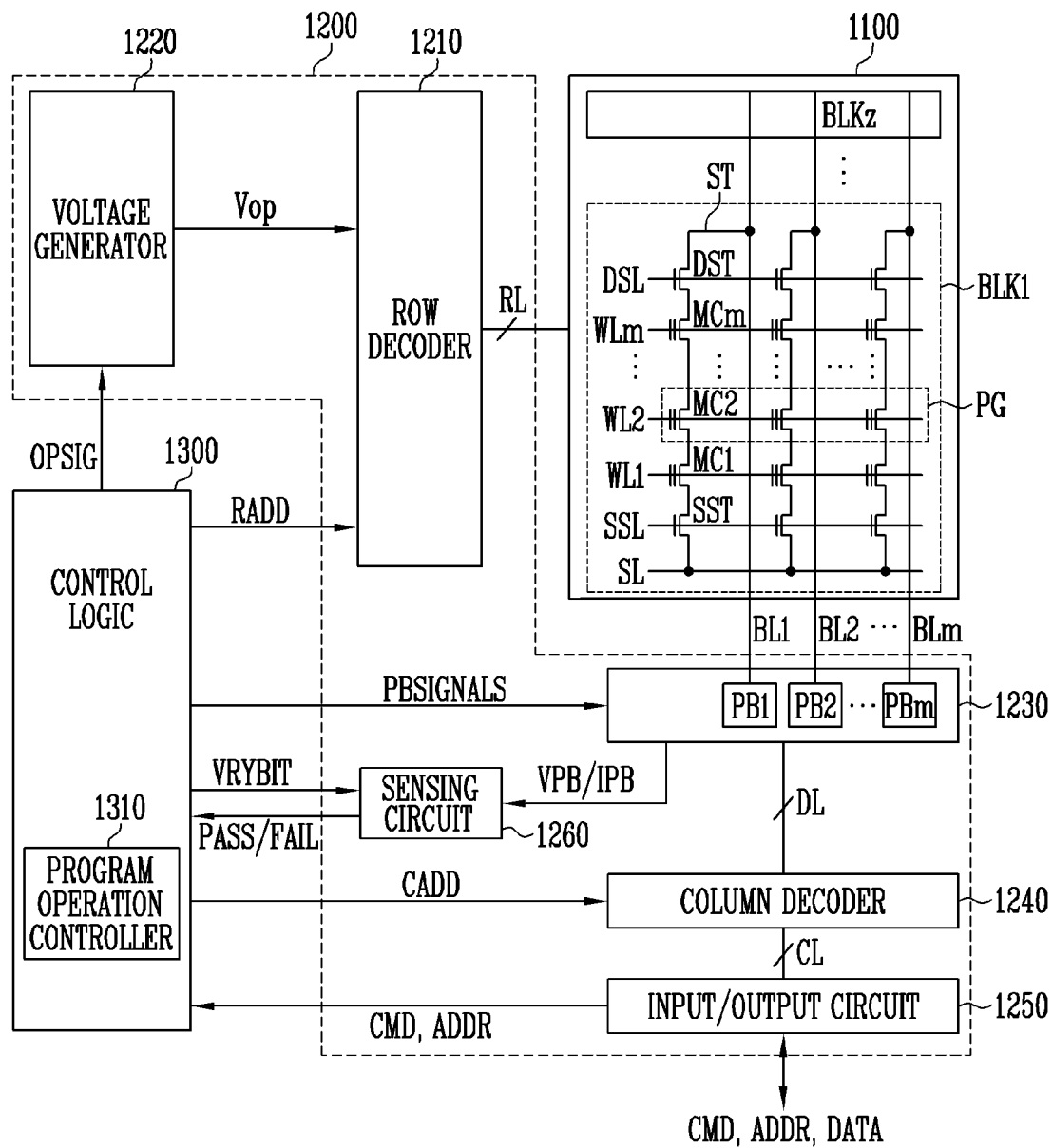
FIG. 2 is a diagram illustrating a memory device according to an embodiment of the present disclosure.

FIG. 2 is a diagram illustrating a memory device according to an embodiment of the present disclosure.

Referring to FIG. 2, the memory device 1000 may include a memory cell array 1100, a peripheral circuit 1200, and control logic 1300.

The memory cell array 1100 includes a plurality of memory blocks BLK1 to BLKz.

The plurality of memory blocks BLK1 to BLKz may be connected to a row decoder 1210 through row lines RL. Here, the row lines RL may include at least one or more source select lines SSL, a plurality of word lines WL1 to WLm, and at least one or more drain select lines DSL. The plurality of memory blocks BLK1 to BLKz may be connected to a page buffer group 1230 through bit lines BL1 to BLm.

The plurality of memory blocks BLK1 to BLKz may include a plurality of memory cell strings ST. The bit lines BL1 to BLm may be connected to a channel region of each of the memory cell strings ST, and a source line SL may be commonly connected to the channel regions of the memory cell strings ST. The memory cell string ST may include at least one or more source select transistors SST, the plurality of memory cells MC1 to MCm, and at least one or more drain select transistors DST connected in series between the source line SL and the bit lines BL1 to BLm. The source select transistor SST, the plurality of memory cells MC1 to MCm, and the drain select transistor DST may be connected by the channel region of the memory cell string ST.

Each of the plurality of memory blocks BLK1 to BLKz may include the plurality of memory cells MC1 to MCm. Memory cells MC1 to MCm connected to the same word line may be defined as one page PG. In an embodiment, the page PG may be a unit for storing data in the memory device 1000 or reading data stored in the memory device 1000.

The peripheral circuit 1200 may be configured to perform the program operation, a read operation, or an erase operation on a selected region of the memory cell array 1100 under control of the control logic 1300.

The peripheral circuit 1200 may include the row decoder 1210, a voltage generator 1220, the page buffer group 1230, a column decoder 1240, an input/output circuit 1250, and a sensing circuit 1260.

The row decoder 1210 may be configured to decode a row address RADD received from the control logic 1300. The row decoder 1210 selects at least one memory block among the memory blocks BLK1 to BLKz according to a decoded address. In addition, the row decoder 1210 may select at least one word line of the selected memory block according to the decoded address. The row decoder 1210 may apply voltages Vop generated by the voltage generator 1220 to the selected word line.

For example, during the program operation, the row decoder 1210 may apply a program voltage to the selected word line and apply a program pass voltage of a level lower than that of the program voltage to unselected word lines. During a program verify operation, the row decoder 1210 may apply a verify voltage to the selected word line and apply a verify pass voltage of a level higher than the verify voltage to the unselected word lines.

The voltage generator 1220 may be configured to generate a plurality of voltages using an external power voltage supplied to the memory device 1000. Specifically, the voltage generator 1220 may generate various operation voltages Vop used for the program, read, and erase operations in response to an operation signal OPSIG. The plurality of generated voltages Vop may be supplied to the memory cell array 1100 by the row decoder 1210.

In an embodiment, the voltage generator 1220 may generate a first program voltage, a first program pass voltage, a first verify voltage, a first verify pass voltage, and the like to be used in a first program operation. In addition, the voltage generator 1220 may generate a second program voltage, a second program pass voltage, a second verify voltage, a second verify pass voltage, and the like to be used in a second program operation.

The page buffer group 1230 includes a plurality of page buffers PB1 to PBm. The plurality of page buffers PB1 to PBm may temporarily store data received through the plurality of bit lines BL1 to BLm in response to page buffer control signals PBSIGNALS. In addition, during the read or verify operation of the plurality of page buffers PB1 to PBm, the plurality of memory cells MC1 to MCm may be sensed. Specifically, the plurality of page buffers PB1 to PBm may sense a voltage or a current of the plurality of bit lines BL1 to BLm connected to the plurality of memory cells MC1 to MCm.

The column decoder 1240 may transfer data between the input/output circuit 1250 and the page buffer group 1230 in response to a column address CADD. The column decoder 1240 may exchange the data DATA with the input/output circuit 1250 through column lines CL and may exchange the data DATA with the page buffer group 1230 through data lines DL.

The input/output circuit 1250 may transfer a command CMD and an address ADDR received from a memory controller (not shown) to the control logic 1300 or exchange data DATA with the column decoder 1240.

During the read operation or the verify operation, the sensing circuit 1260 may generate a reference current in response to an allowable bit VRYBIT, compare a sensing voltage VPB received from the page buffer group 1230 with a reference voltage generated by the reference current, and output a pass signal PASS or a fail signal FAIL. Alternatively, the sensing circuit 1260 may generate the reference voltage in response to the allowable bit VRYBIT, compare a sensing current IPB received from the page buffer group 1230 with a reference current generated by the reference voltage, and output the pass signal PASS or the fail signal FAIL.

The control logic 1300 may output the operation signal OPSIG, the row address RADD, the page buffer control signals PBSIGNALS, and the allowable bit VRYBIT in response to the command CMD and the address ADDR to control the peripheral circuit 1200. The control logic 1300 may be implemented as hardware, software, or a combination of hardware and software. For example, the control logic 1300 may be a control logic circuit operating in accordance with an algorithm and/or a processor executing control logic code.

In an embodiment, the control logic 1300 may include a program operation controller 1310. In an embodiment, the program operation controller 1310 may be implemented as hardware, software, or a combination of hardware and software. For example, the program operation controller 1310 may be a circuit that operates according to an algorithm, a processor, or a processor that executes a code.

The program operation controller 1310 may control the program operation of the memory device 1000. For example, the program operation controller 1310 may control the peripheral circuit 1200 to perform the first program operation on the first memory cells. In addition, the program operation controller 1310 may control the peripheral circuit 1200 to perform the second program operation on the second memory cells. In addition, the program operation controller 1310 may determine the third memory cells among the first memory cells and control the peripheral circuit 1200 to perform the third program operation on the third memory cells.

Figure 3A:
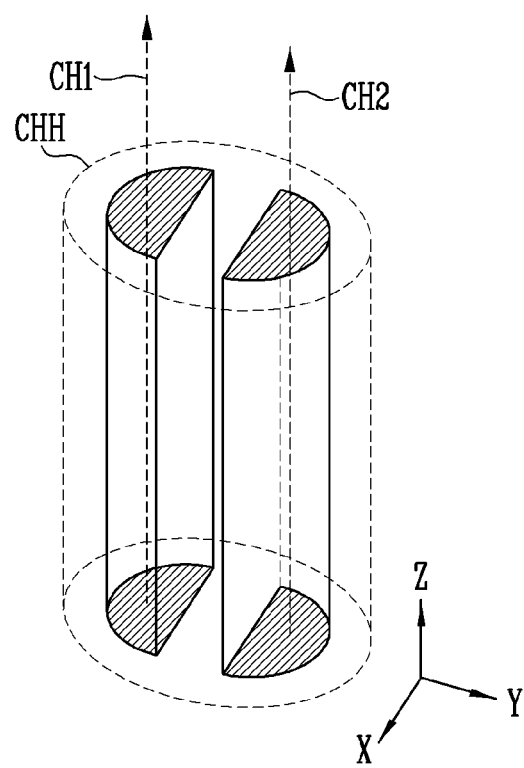
FIGS. 3A and 3B are diagrams illustrating a structure of a memory cell according to an embodiment of the present disclosure.
Figure 3B:
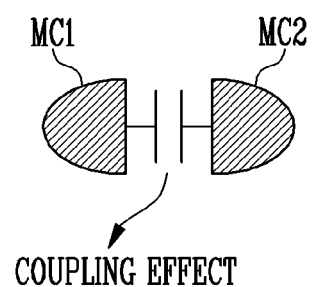

FIGS. 3A and 3B are diagrams illustrating a structure of a memory cell according to an embodiment of the present disclosure.

In FIGS. 3A and 3B, a structure in which a channel hole CHH is divided into two channel regions is described for convenience of description, but is not necessarily limited thereto. According to an embodiment, the channel hole may be divided into three or more channel regions.

Specifically, FIG. 3A may represent a perspective view of memory cells included in the channel hole CHH, and FIG. 3B may represent a cross-sectional view of the memory cells.

Referring to FIGS. 3A and 3B, one channel hole CHH may be divided into a first channel region CH1 and a second channel region CH2 through a cutting structure. Here, the channel region may mean a channel region of a memory cell string. First memory cells MC1 may be connected to the first channel region CH1, and second memory cells MC2 may be connected to the second channel region CH2. Accordingly, a plurality of memory cells may be formed in one layer.

In addition, because the first memory cells MC1 and the second memory cells MC2 are adjacent to each other, a coupling effect may occur. Accordingly, when the program operation is performed on the first memory cells MC1, a threshold voltage distribution of the second memory cells MC2 may be affected by the coupling effect. In addition, when the program operation is performed on the second memory cells MC2, a threshold voltage distribution of the first memory cells MC1 may be affected by the coupling effect. This is described in detail with reference to FIG. 4 to be described later.

Figure 4:
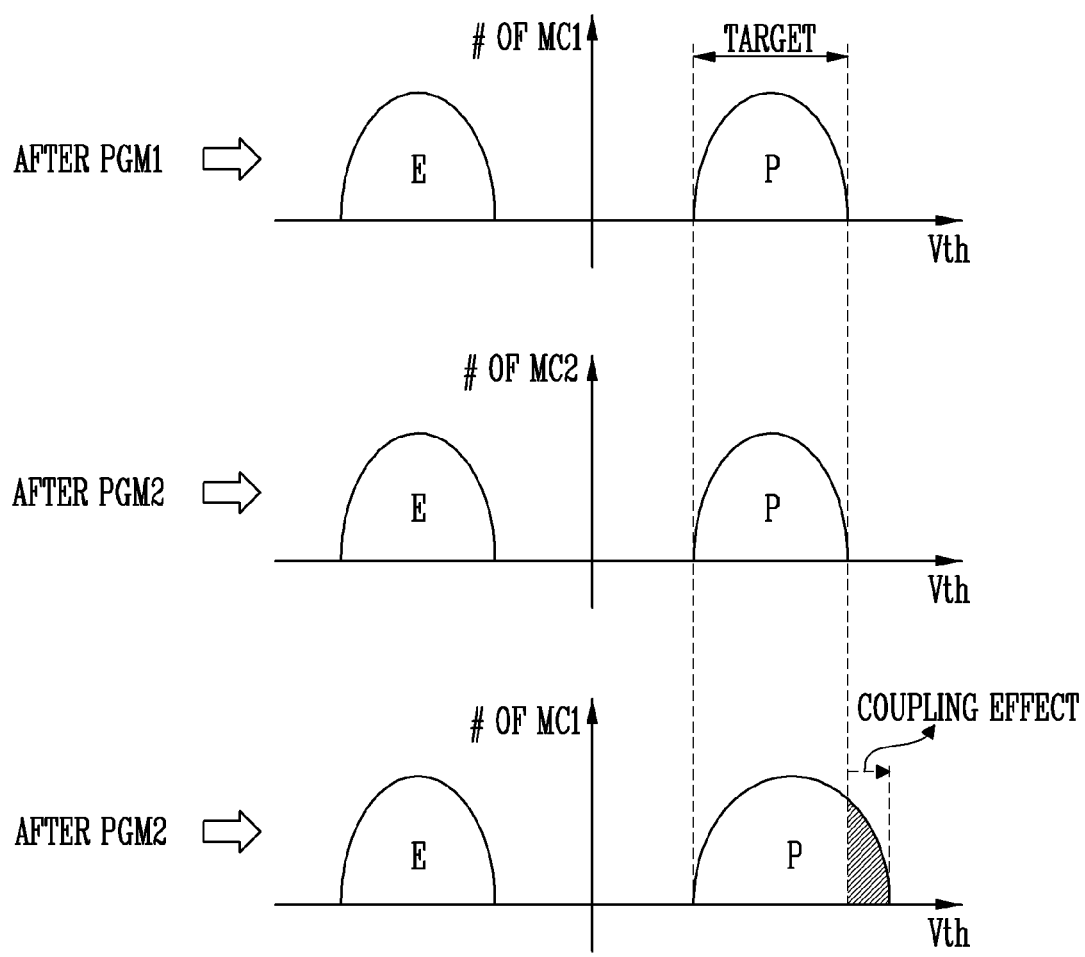
FIG. 4 is a diagram illustrating a threshold voltage distribution of a memory cell according to an embodiment of the present disclosure.

FIG. 4 is a diagram illustrating a threshold voltage distribution of a memory cell according to an embodiment of the present disclosure. In FIG. 4, the horizontal axis indicates the threshold voltage Vth and the vertical axis indicates the number of memory cells. In FIG. 4, a threshold voltage distribution of the first memory cells MC1 after a first program operation PGM1 is completed, a threshold voltage distribution of the second memory cells MC2 after a second program operation PGM2 is completed, and the threshold voltage distribution of the first memory cells MC1 after the second program operation PGM2 is completed may be shown, in an order from a graph shown at the uppermost end. In addition, a program voltage and a verify voltage used in the first program operation PGM1 and the second program operation PGM2 may be the same.

Referring to FIG. 4, after the first program operation PGM1 on the first memory cells MC1 is completed, selected memory cells among the first memory cells MC1 may have a target threshold voltage distribution TARGET corresponding to a target program state P. In addition, unselected memory cells among the first memory cells MC1 may have a threshold voltage distribution corresponding to an erase state E.

Thereafter, when the second program operation PGM2 on the second memory cells MC2 is completed, selected memory cells among the second memory cells MC2 may have a target threshold voltage distribution TARGET corresponding to the target program state P. In addition, unselected memory cells among the second memory cells MC2 may have the threshold voltage distribution corresponding to the erase state E.

Meanwhile, when the second program operation PGM2 on the second memory cells MC2 is completed, the threshold voltage distribution of the selected memory cells among the first memory cells MC1 may be changed due to the coupling effect. Specifically, the threshold voltage distribution of the selected memory cells among the first memory cells MC1 may become widened, and memory cells having a threshold voltage higher than the target threshold voltage distribution TARGET may be generated.

Hereinafter, first to third program operations for improving the threshold voltage distribution of the first memory cells MC1 is described.

Figure 5:
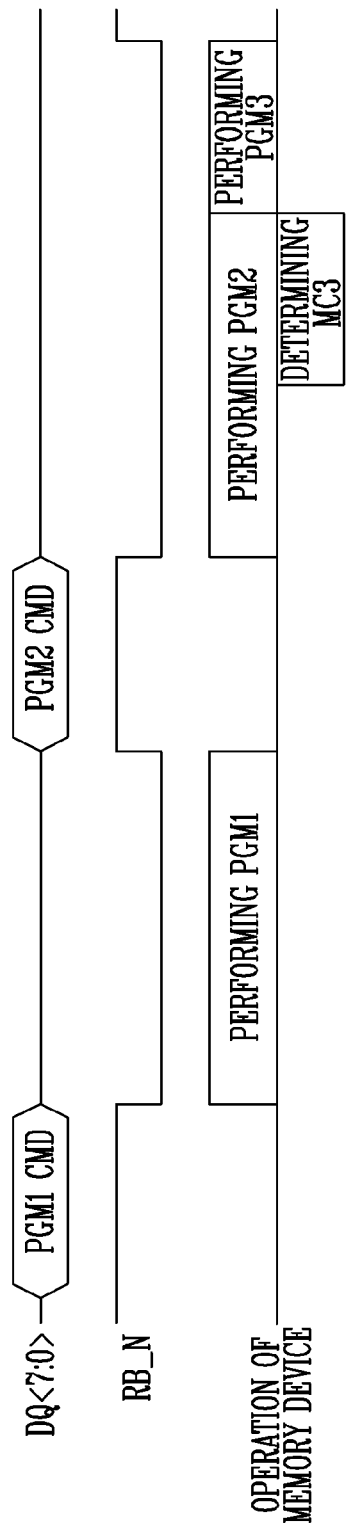
FIG. 5 is a diagram illustrating first to third program operations according to an embodiment of the present disclosure.

FIG. 5 is a diagram illustrating first to third program operations according to an embodiment of the present disclosure.

Referring to FIG. 5, a method in which the memory device 1000 performs the first to third program operations is shown over time. The memory device 1000 may receive a program command from the memory controller through input/output terminals DQ<7:0> of the input/output circuit 1250. However, although not shown, the memory device 1000 may also receive data to be programmed and an address indicating a region in which the data is to be programmed, together with the program command. When a ready busy signal RB_N is output at a low level, the ready busy signal RB_N may indicate that the memory device 1000 is in a busy state. When the ready busy signal RB_N is output at a high level, the ready busy signal RB_N may indicate that the memory device 1000 is in a ready state.

The memory device 1000 may receive a first program command PGM1 CMD.

The memory device 1000 may perform the first program operation PGM1 on the first memory cells MC1 based on the first verify voltage in response to the first program command PGM1 CMD. When the first program operation PGM1 is completed, the memory device 1000 may indicate the ready state through the ready busy signal RB_N.

The memory device 1000 may receive a second program command PGM2 CMD.

The memory device 1000 may perform the second program operation PGM2 on the second memory cells MC2 based on the second verify voltage in response to the second program command PGM2 CMD. In addition, the memory device 1000 may determine third memory cells MC3 among the first memory cells MC1 while performing the second program operation PGM2 in response to the second program command PGM2 CMD.

When the second program operation PGM2 is completed, the memory device 1000 may perform a third program operation PGM3 on the third memory cells MC3 in response to the second program command PGM2 CMD.

In an embodiment, during the third program operation PGM3, remaining cells except for the third memory cells among the first memory cells may be set to a program inhibit voltage. Accordingly, the program pass voltage may be applied to the remaining cells.

Meanwhile, the program voltage, the program pass voltage, the verify voltage, and the verify pass voltage used during the third program operation PGM3 may be set variously according to an embodiment.

Figure 6:
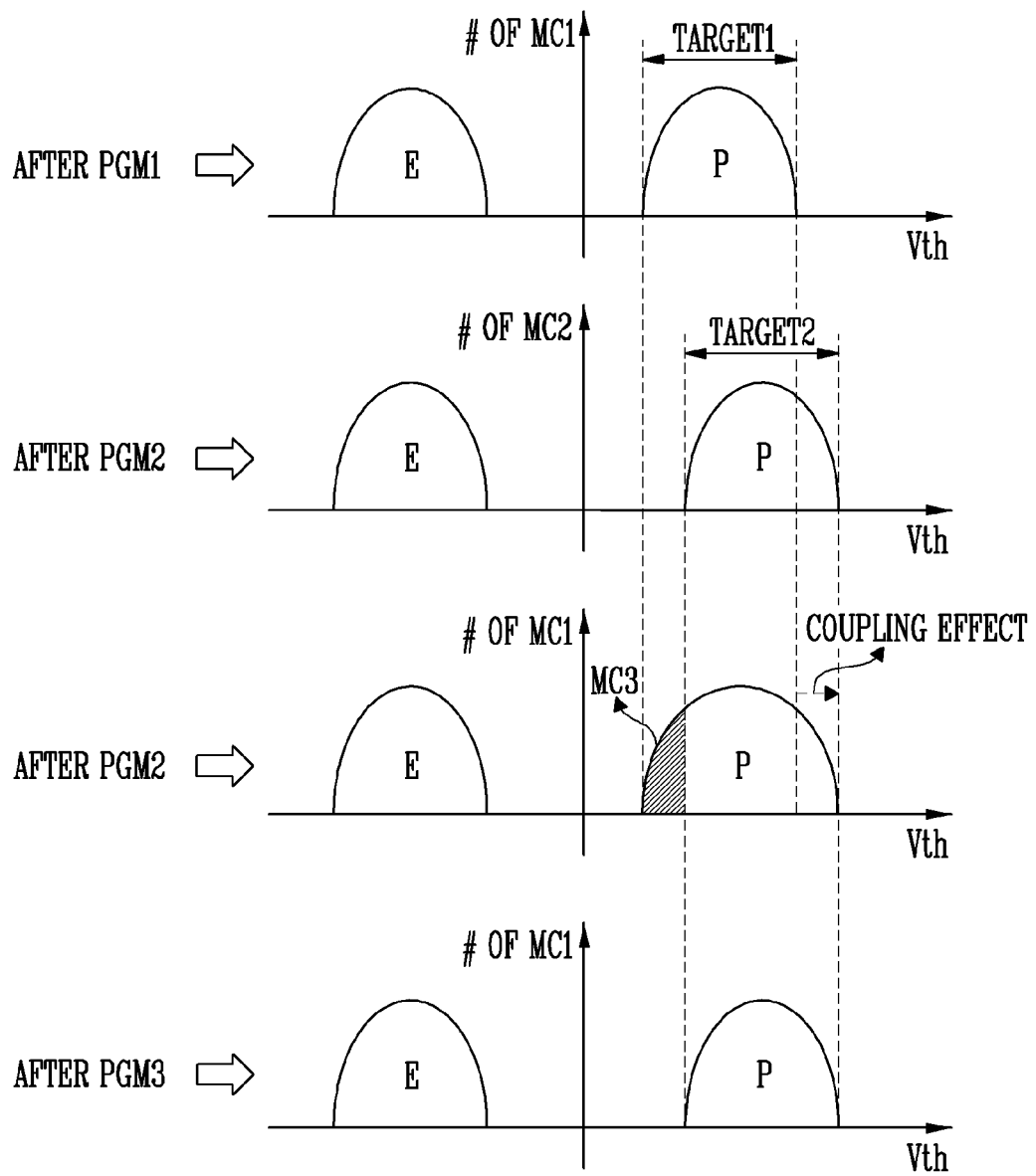
FIG. 6 is a diagram illustrating a threshold voltage distribution of a memory cell during the first to third program operations of FIG. 5.

FIG. 6 is a diagram illustrating a threshold voltage distribution of a memory cell during the first to third program operations of FIG. 5. In FIG. 6, the horizontal axis indicates the threshold voltage Vth and the vertical axis indicates the number of memory cells. In FIG. 6, the threshold voltage distribution of the first memory cells MC1 after the first program operation PGM1 is completed, the threshold voltage distribution of the second memory cells MC2 after the second program operation PGM2 is completed, the threshold voltage distribution of the first memory cells MC1 after the second program operation PGM2 is completed, and the threshold voltage distribution of the first memory cells MC1 after the third program operation PGM3 is completed may be shown in an order from a graph shown at the uppermost end.

Referring to FIG. 6, after the first program operation PGM1 on the first memory cells MC1 is completed, the selected memory cells among the first memory cells MC1 may have a first target threshold voltage distribution TARGET1 lower than a second target threshold voltage distribution which is a final target. In addition, the unselected memory cells among the first memory cells MC1 may have the threshold voltage distribution corresponding to the erase state E.

Thereafter, when the second program operation PGM2 on the second memory cells MC2 is completed, the selected memory cells among the second memory cells MC2 may have the second target threshold voltage distribution TARGET2 corresponding to the target program state P. In addition, the unselected memory cells among the second memory cells MC2 may have the threshold voltage distribution corresponding to the erase state E.

In addition, when the second program operation PGM2 on the second memory cells MC2 is completed, the threshold voltage distribution of the selected memory cells among the first memory cells MC1 may be changed due to the coupling effect. Specifically, the threshold voltage distribution of the selected memory cells among the first memory cells MC1 may become widened. Accordingly, memory cells having a threshold voltage higher than the second target threshold voltage distribution TARGET2 among the first memory cells MC1 do not exist. However, the third memory cells MC3 having a threshold voltage lower than the second target threshold voltage distribution TARGET2 among the first memory cells MC1 may exist.

Thereafter, when the third program operation PGM3 on the third memory cells MC3 is completed, the third memory cells MC3 may have the second target threshold voltage distribution TARGET2. Accordingly, all of the first memory cells may have the second target threshold voltage distribution TARGET2.

FIG. 7 is a diagram illustrating voltages generated during a program operation according to an embodiment of the present disclosure.

Referring to FIG. 7, the memory device 1000 may apply a plurality of program voltages to word lines connected to selected memory cells among the first memory cells in the first program operation PGM1. At this time, the plurality of program voltages may be voltages increasing by a first unit voltage V1 from the first program voltage Vpgm1 which is a start program voltage.

The memory device 1000 may apply the plurality of program voltages to word lines connected to selected memory cells among the second memory cells in the second program operation PGM2. At this time, the plurality of program voltages may be voltages increasing by a second unit voltage V2 from the second program voltage Vpgm2 which is a start program voltage.

In an embodiment, the second program voltage Vpgm2 may be higher than the first program voltage Vpgm1. In addition, the second unit voltage V2 may be lower than the first unit voltage V1.

In addition, the memory device 1000 may verify a program state of the first memory cells based on a first verify voltage Vvfy1 after each program voltage is applied in the first program operation PGM1.

The memory device 1000 may verify a program state of the second memory cells based on a second verify voltage Vvfy2 in the second program operation PGM2. In an embodiment, the first verify voltage Vvfy1 may be lower than the second verify voltage Vvfy2.

In addition, the memory device 1000 may apply a first program pass voltage VpassP1 to a word line connected to unselected memory cells among the first memory cells simultaneously with applying the plurality of program voltages to the word lines connected to the selected memory cells in the first program operation PGM1.

The memory device 1000 may apply a second program pass voltage VpassP2 to a word line connected to unselected memory cells among the second memory cells simultaneously with applying the plurality of program voltages to the word line connected to the selected memory cells in the second program operation PGM2. In an embodiment, the second program pass voltage VpassP2 may be higher than the first program pass voltage VpassP1.

In addition, in an operation of verifying the program state of the first memory cells, the memory device 1000 may apply the first verify voltage Vvfy1 to the word line connected to the selected memory cells, and apply a first verify pass voltage VpassV1 to the word line connected to the unselected memory cells.

In an operation of verifying the program state of the second memory cells, the memory device 1000 may apply the second verify voltage Vvfy2 to the word line connected to the selected memory cells, and apply a second verify pass voltage VpassV2 to the word line connected to the unselected memory cells. In an embodiment, the second verify pass voltage VpassV2 may be higher than the first verify pass voltage VpassV1.

FIGS. 8A and 8B are a diagram and a table illustrating an order in which a program operation is performed according to an embodiment of the present disclosure. Specifically, FIG. 8A may represent a cross-sectional view of memory cells, and FIG. 8B may represent a characteristic of the memory cells.

Referring to FIGS. 8A and 8B, in a process of separating the channel hole, the first channel region and the second channel region may not be accurately separated. In this case, the cross-sectional areas of memory cells connected to each channel region, the number of bits stored in the memory cells, and the like may be different.

For example, when the channel hole is separated, left memory cells MCL may be smaller than right memory cells MCR. In this case, each of the left memory cells MCL may store fewer bits than each of the right memory cells MCR.

In an embodiment, the memory device 1000 may first perform the program operation on memory cells having a relatively small number of bits stored in the memory cells, and then perform the program operation on memory cells having a relatively large number of bits stored in the memory cells.

For example, the memory device 1000 may perform the first program operation on the left memory cells MCL and perform the second program operation on the right memory cells MCR. In other words, each of memory cells which are targets of the first program operation may store bits of the number less than that of each of memory cells which are targets of the second program operation.

Figure 9:
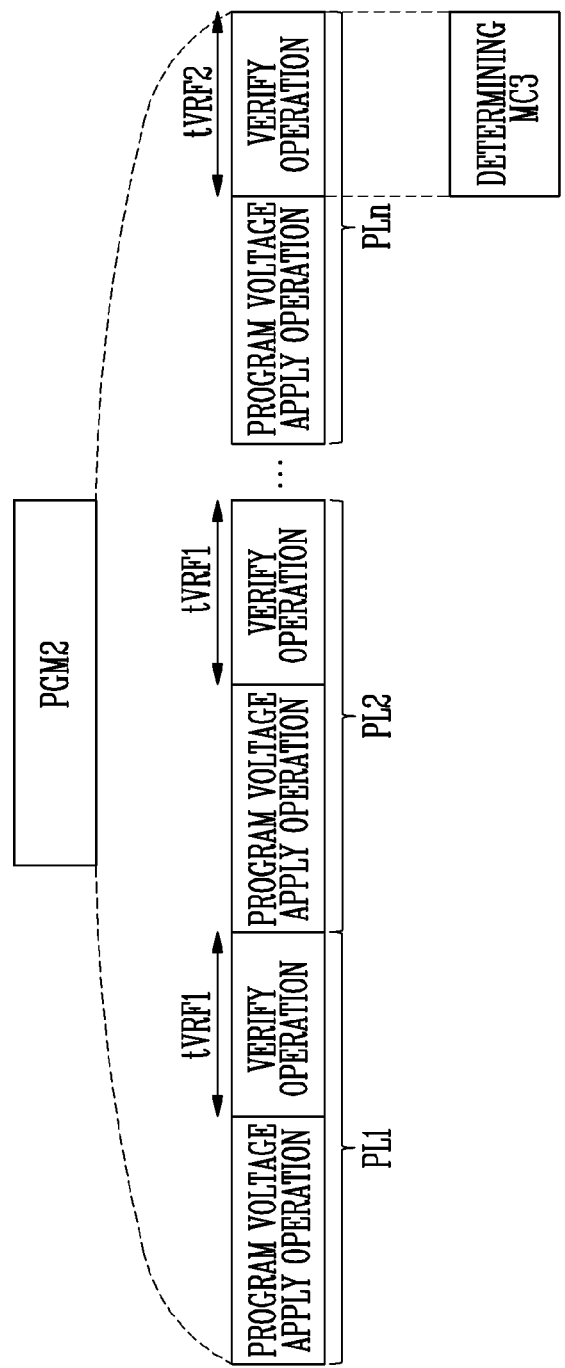
FIG. 9 is a diagram illustrating a time point when an operation of determining a third memory cell is performed according to an embodiment of the disclosure.

FIG. 9 is a diagram illustrating a time point when an operation of determining a third memory cell is performed according to an embodiment of the disclosure.

Referring to FIG. 9, the second program operation PGM2 may include a plurality of program loops PL1 to PLn.

Each of the plurality of program loops PL1 to PLn may include a program voltage apply operation and a verify operation.

In an embodiment, the memory device 1000 may determine the third memory cell MC3 while performing any one verify operation among a plurality of verify operations included in the second program operation PGM2. Specifically, the memory device 1000 may determine the third memory cell MC3 while performing a verify operation included in the last program loop PLn.

In an embodiment, the memory device 1000 may perform any one verify operation longer than remaining verify operations except for the any one verify operation among the plurality of verify operations. For example, a performance period tVRF2 of the verify operation included in the last program loop PLn may be longer than a performance period tVRF1 of the remaining verify operations.

Figure 10:
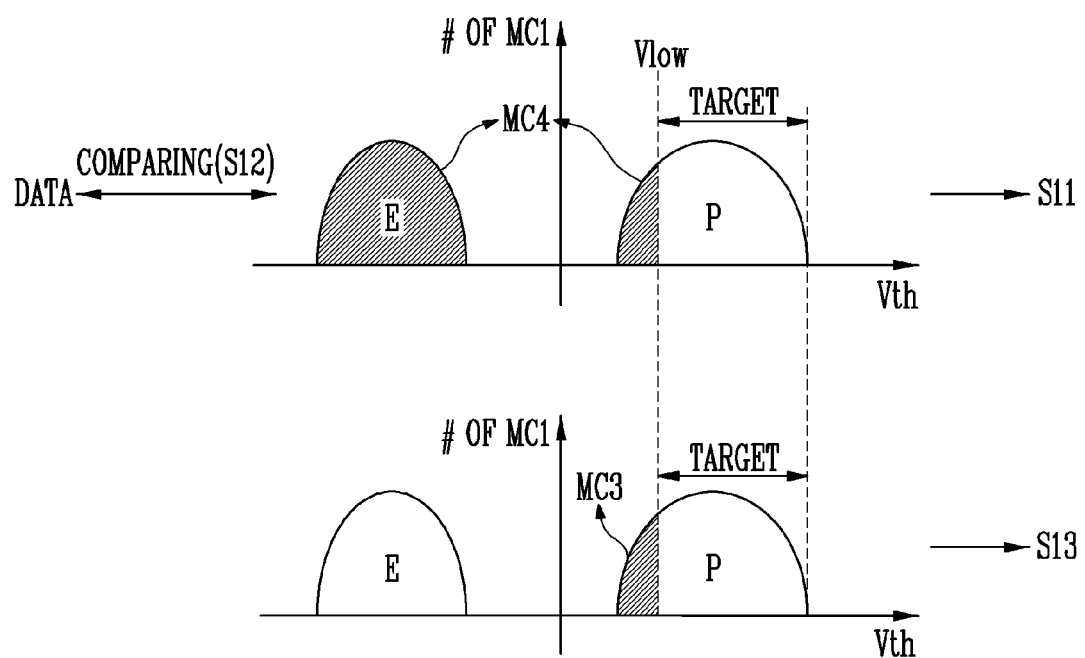
FIG. 10 is a diagram illustrating a method of determining a third memory cell according to an embodiment of the disclosure.

FIG. 10 is a diagram illustrating a method of determining a third memory cell according to an embodiment of the disclosure. In FIG. 10, the horizontal axis indicates the threshold voltage Vth and the vertical axis indicates the number of memory cells. The target threshold voltage distribution TARGET of FIG. 10 may represent the second target threshold voltage distribution TARGET2 of FIG. 6 as the final target threshold voltage distribution. In addition, a graph of FIG. 10 may represent the threshold voltage distribution of the first memory cells MC1 after a last program voltage apply operation of the second program operation is completed.

Referring to FIG. 10, in step S11, the memory device 1000 may determine fourth memory cells MC4 among the first memory cells MC1. At this time, the fourth memory cells MC4 may have a threshold voltage lower than a lowest threshold voltage Vlow of the target threshold voltage distribution TARGET. Specifically, the memory device 1000 may sense the fourth memory cells MC4 based on the lowest threshold voltage Vlow.

Thereafter, the memory device 1000 may determine the third memory cells MC3 based on data DATA and the fourth memory cells MC4.

Specifically, in step S12, the memory device 1000 may compare the data DATA to be programmed to the first memory cells MC1 and the fourth memory cells MC4. At this time, the data DATA may be data DATA received from the memory controller during the first program operation and backed up in the page buffer group.

In step S13, the memory device 1000 may determine the third memory cell MC3 based on a result of comparing the data DATA and the fourth memory cells MC4. Specifically, the memory device 1000 may check memory cells having the erase state E through the data DATA. The memory device 1000 may determine the third memory cells MC3 by removing the memory cells having the erase state E among the fourth memory cells MC4.

What is claimed is:

1. A method of operating a memory device, the method comprising:
    performing a first program operation on first memory cells connected to a first channel region among a plurality of channel regions formed by separating one channel hole into the plurality of channel regions, based on a first verify voltage;

performing a second program operation on second memory cells connected to a second channel region among the plurality of channel regions, based on a second verify voltage;

determining third memory cells having a threshold voltage lower than a target threshold voltage distribution among the first memory cells while performing the second program operation; and performing a third program operation on the third memory cells.

2. The method of claim 1, wherein the first verify voltage is lower than the second verify voltage.

3. The method of claim 1, wherein each of the first memory cells stores fewer bits than each of the second memory cells.

4. The method of claim 1, wherein performing the first program operation comprises:

applying a plurality of program voltages increasing by a first unit voltage from a first program voltage to word lines connected to selected memory cells among the first memory cells; and verifying a program state of the first memory cells based on the first verify voltage.

5. The method of claim 4, wherein performing the second program operation comprises:

applying a plurality of program voltages increasing by a second unit voltage lower than the first unit voltage from a second program voltage higher than the first program voltage to word lines connected to selected memory cells among the second memory cells; and verifying a program state of the second memory cells based on the second verify voltage.

6. The method of claim 5, wherein performing the first program operation further comprises applying a first program pass voltage to a word line connected to unselected memory cells among the first memory cells simultaneously with applying the plurality of program voltages increasing by the first unit voltage.

7. The method of claim 6, wherein performing the second program operation further comprises applying a second program pass voltage higher than the first program pass voltage to a word line connected to unselected memory cells among the second memory cells simultaneously with applying the plurality of program voltages increasing by the second unit voltage.

8. The method of claim 5, wherein verifying the program state of the first memory cells comprises:

applying the first verify voltage to a word line connected to selected memory cells among the first memory cells; and applying a first verify pass voltage to a word line connected to unselected memory cells among the first memory cells.

9. The method of claim 8, wherein verifying the program state of the second memory cells comprises:

applying the second verify voltage to a word line connected to selected memory cells among the second memory cells; and applying a second verify pass voltage higher than the first verify pass voltage to a word line connected to unselected memory cells among the second memory cells.

10. The method of claim 1, wherein the third memory cells are memory cells included in selected memory cells among the first memory cells.

11. The method of claim 1, wherein determining comprises:

determining fourth memory cells having a threshold voltage lower than a lowest threshold voltage of the target threshold voltage distribution among the first memory cells; and determining the third memory cells based on data to be programmed to the first memory cells and the fourth memory cells.

12. The method of claim 1, wherein determining comprises determining the third memory cells while any one verify operation among a plurality of verify operations included in the second program operation is performed.

13. The method of claim 12, wherein performing the second program operation comprises performing the any one verify operation longer than other verify operations except for the any one verify operation among the plurality of verify operations.

14. The method of claim 1, wherein performing the second program operation, detecting, and performing the third program operation are performed in response to one program command.

15. A method of operating a memory device, the method comprising:

performing a first program operation so that first memory cells connected to a first channel region among a plurality of channel regions, formed by separating one channel hole into the plurality of channel regions, are included in a first target threshold voltage distribution;

performing a second program operation so that second memory cells connected to a second channel region among the plurality of channel regions are included in a second target threshold voltage distribution;

detecting third memory cells having a threshold voltage lower than the second target threshold voltage distribution among the first memory cells while performing the second program operation; and performing a third program operation on the third memory cells.

16. The method of claim 15, wherein the first target threshold voltage distribution includes threshold voltages lower than a highest threshold voltage of the second target threshold voltage distribution.

17. The method of claim 15, wherein performing the third program operation comprises performing the third program operation so that the third memory cells are included in the second target threshold voltage distribution.

18. A memory device comprising:

first memory cells connected to a first channel region;

second memory cells connected to a second channel region adjacent to the first channel region;

a voltage generator configured to generate a plurality of program voltages, a first verify voltage, and a second verify voltage higher than the first verify voltage;

a row decoder configured to apply the plurality of program voltages to a word line connected to selected memory cells among the first memory cells or to apply the plurality of program voltages to a word line connected to selected memory cells among the second memory cells;

a page buffer group configured to sense the first memory cells based on the first verify voltage or sense the second memory cells based on the second verify voltage; and control logic configured to control the voltage generator, the row decoder, and the page buffer group to perform a program operation on the first memory cells based on the plurality of program voltages and the first verify voltage, perform the program operation on the second memory cells based on the plurality of program voltages and the second verify voltage, and additionally perform the program operation on some memory cells among the first memory cells.

19. The memory device of claim 18, wherein the first channel region and the second channel region are formed by separating one channel hole into a plurality of channel regions including the first channel region and the second channel region.

* * * * *